(12) United States Patent
Furui et al.

(10) Patent No.: US 8,034,183 B2
(45) Date of Patent: Oct. 11, 2011

(54) CLEANING METHOD AND PLASMA PROCESSING METHOD

(75) Inventors: Shingo Furui, Higashiosaka (JP); Takashi Kobayashi, Amagasaki (JP); Junichi Kitagawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 382 days.

(21) Appl. No.: 11/883,523

(22) PCT Filed: Jan. 23, 2006

(86) PCT No.: PCT/JP2006/300957
§ 371 (c)(1),
(2), (4) Date: May 27, 2008

(87) PCT Pub. No.: WO2006/082724
PCT Pub. Date: Aug. 10, 2006

(65) Prior Publication Data
US 2008/0317975 A1   Dec. 25, 2008

(30) Foreign Application Priority Data

Feb. 2, 2005   (JP) .................................. 2005-026589

(51) Int. Cl.
*B08B 7/04* (2006.01)
*B08B 7/00* (2006.01)
(52) U.S. Cl. ............ 134/1.1; 134/1; 134/22.18; 134/26; 134/30; 438/905

(58) Field of Classification Search ................ 134/1, 1.1, 134/1.2, 1.3, 26, 30, 22.1, 22.18; 438/905
See application file for complete search history.

(56) References Cited

U.S. PATENT DOCUMENTS

| 6,656,376 B1 | 12/2003 | Fritsch et al. | |
|---|---|---|---|
| 6,834,656 B2 * | 12/2004 | Qingyuan et al. | 134/1.3 |
| 2001/0042513 A1 * | 11/2001 | Kao et al. | 118/723 MR |
| 2005/0191827 A1 * | 9/2005 | Collins et al. | 438/513 |
| 2006/0281323 A1 * | 12/2006 | Ohmi et al. | 438/710 |
| 2007/0077737 A1 * | 4/2007 | Kobayashi et al. | 438/513 |

FOREIGN PATENT DOCUMENTS

| JP | 6097075 | 4/1994 |
|---|---|---|
| JP | 2000-096241 | 4/2000 |
| JP | 2004-335789 | 11/2004 |
| WO | WO 2004/100246 | 11/2004 |

OTHER PUBLICATIONS

International Search Report (Form PCT/ISA/210) in connection with PCT/JP2006/300957, dated Apr. 2005.

* cited by examiner

*Primary Examiner* — Alexander Markoff
(74) *Attorney, Agent, or Firm* — Smith, Gambrell & Russell, LLP

(57) ABSTRACT

In a RLSA microwave plasma processing apparatus that radiates microwave from a microwave generator into a chamber by using a planer antenna (Radial Line Slot Antenna) having many slots formed according to a certain pattern, the chamber contaminated with Na or the like is cleaned by using a cleaning gas containing $H_2$ and $O_2$.

7 Claims, 9 Drawing Sheets

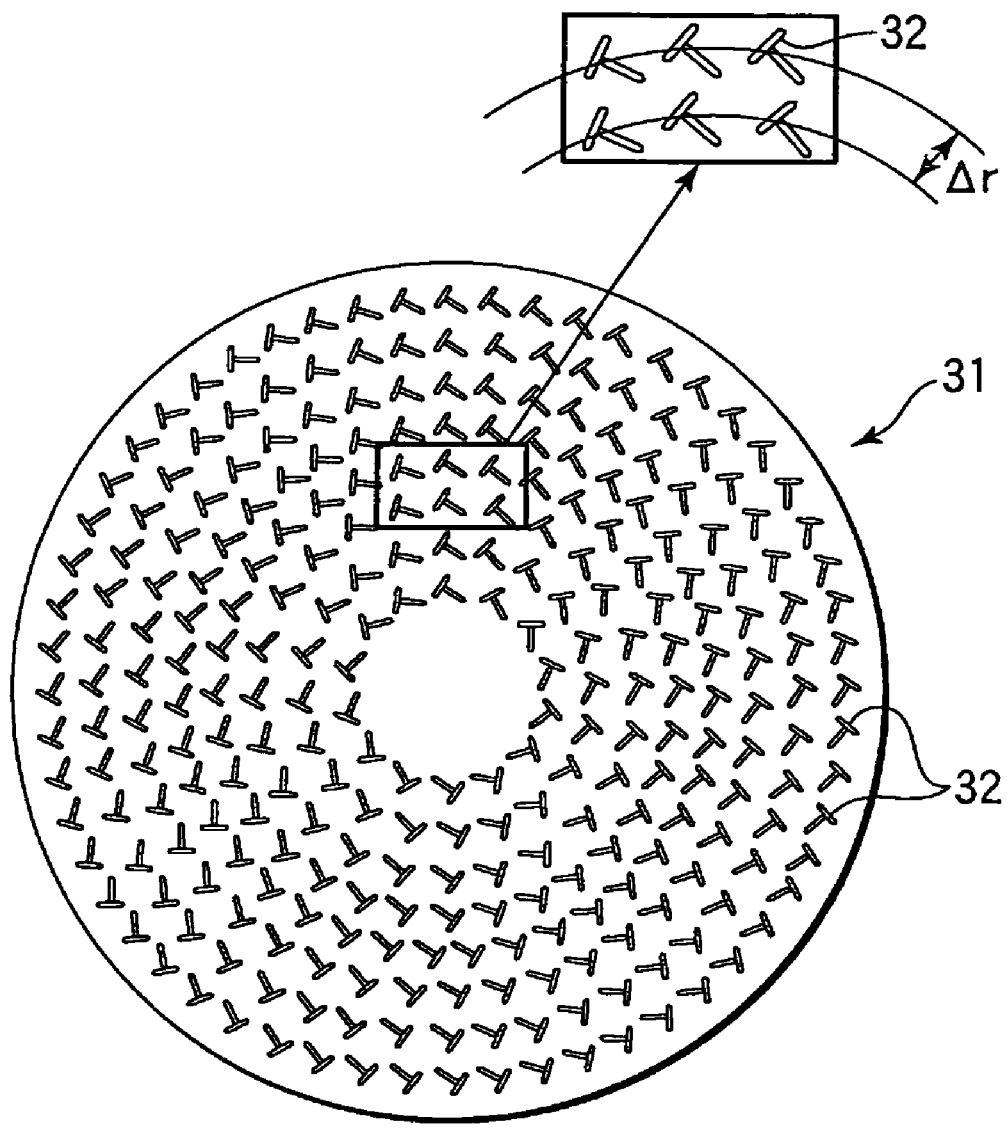
F I G. 2

CLEANING METHOD AND PLASMA PROCESSING METHOD

TECHNICAL FIELD

The present invention relates to a cleaning method and a plasma processing method, and more particularly, to a cleaning method and a plasma processing method that perform, in a plasma processing apparatus, a cleaning to a process chamber contaminated with metals such as Na.

BACKGROUND ART

In plasma processing apparatus used to process substrates to be processed, such as semiconductor wafers, in the manufacturing processes of various semiconductor devices, it is important to reduce metallic contaminants which adversely affect semiconductor devices. In particular, alkali metals such as Na derived from human bodies is a contaminant giving great influence on the characteristics of the device, since it easily causes contamination via chamber internal components and has a property of moving diffusively in a semiconductor device once it is introduced in the device.

The countermeasure against Na contamination derived from human bodies, which may occur during setting-up of a plasma processing apparatus or maintenance of the plasma processing apparatus, is carried out by, opening the chamber to the atmosphere, performing a wet-cleaning of chamber internal components by using a cleaning liquid such as water of isopropyl alcohol, and further wiping the inner wall of the chamber with a wiper impregnated with water or a solvent. Further, after the cleaning, plasma conditioning is carried out over a long period of time.

However, such cleaning process including the wet cleaning and the plasma conditioning spend several hours, including the time for opening of the process chamber to the atmosphere, the time for wet cleaning, the time for re-evacuation and the time for conditioning of the process chamber. This results in a lower efficiency of semiconductor device manufacturing. Although methods of cleaning the inside of a chamber using plasma has been proposed (for example, Patent Document 1), a method effective for Na contamination has not been proposed.

Patent Document 1: Japanese Patent Laid-Open No. 1994-97075.

DISCLOSURE OF THE INVENTION

The present invention has been made in view of the foregoing circumstances, and it is therefore an object of the present invention to provide a cleaning method that cleans a process chamber of a plasma processing apparatus contaminated with Na or the like quickly and reliably with the use of plasma.

In order to foregoing object, according to a first aspect of the present invention, there is provided a cleaning method for cleaning a process chamber of a substrate processing apparatus which processes a substrate to be processed under a condition of a reduced pressure, wherein the method introduces a cleaning gas into the process chamber and generating a plasma of the cleaning gas, and removes contaminants in the process chamber by active species, which are contained in the plasma and are composed of H and O.

According to a second aspect of the present invention, there is provided a cleaning method for cleaning a process chamber of a substrate processing apparatus which processes a substrate under a condition of a reduced pressure, wherein the method introduces a cleaning gas containing at least $H_2O$ into the process chamber and generating a plasma of the cleaning gas, and removes contaminants in the process chamber.

According to a third aspect of the present invention, there is provided a cleaning method for cleaning a process chamber of a substrate processing apparatus which processes a substrate under a condition of a reduced pressure, wherein the method introduces a cleaning gas containing at least $H_2$ gas and $O_2$ gas into the process chamber and generating a plasma of the cleaning gas, and removes contaminants in the process chamber.

In the third aspect, it is preferable that a flow rate ratio of the $H_2$ gas and the $O_2$ gas contained in the cleaning gas is in a range of about 1:1 to 5:1.

In any of the first through third aspects, it is preferable that cleaning is performed without opening to an atmosphere after the substrate is processed. Further, it is preferable that the contaminants are alkali metals or alkali earth metals present in the process chamber. Further, it is preferable that the cleaning is performed by using a plasma of an inductively-coupled type, a plasma of a parallel plate type or a plasma of a planar antenna type, or by using a plasma formed by introducing microwaves into the process chamber by using a planer antenna having a plurality of slots.

According to a fourth aspect of the present invention, there is provided a control program which runs on a computer, wherein, upon execution, the program controls a substrate processing apparatus so as to perform a cleaning method that: introduces a cleaning gas containing at least $H_2$ gas and $O_2$ gas into a process chamber of the substrate processing apparatus which processes a substrate to be processed under a condition of a reduced pressure; generates a plasma of the cleaning gas; and removes contaminants in the process chamber.

According to a fifth aspect of the present invention, there is provided a computer-readable storage medium in which a control program that runs on a computer is stored, wherein, the control program, upon execution thereof, controls a substrate processing apparatus so as to perform a cleaning method that: introduces a cleaning gas containing at least $H_2$ gas and $O_2$ gas into a process chamber of the substrate processing apparatus which processes a substrate to be processed under a condition of a reduced pressure; generates a plasma of the cleaning gas; and removes contaminants in the process chamber.

According to a sixth aspect of the present invention, there is provided a plasma processing apparatus comprising: a plasma supply source that generates a plasma; a process vessel defining a process chamber for performing a process for a substrate to be processed by using the plasma; a substrate support table that supports thereon the substrate in the process vessel; exhaust means for decompressing an interior of the process vessel; gas supply means for supplying a gas into the process vessel; and a control unit that performs control such that there is performed a cleaning method that introduces a cleaning gas containing at least $H_2$ gas and $O_2$ gas into the process chamber, generates a plasma of the cleaning gas, and removes contaminants in the process chamber.

According to a seventh aspect of the present invention, there is provided a plasma processing method that performs a process to a substrate to be processed under a condition of a reduced pressure, the method comprising: a cleaning step that introduces a cleaning gas containing at least $H_2$ gas and $O_2$ gas into the process chamber, generates a plasma of the cleaning gas, and removes contaminants in the process chamber; a plasma processing step that performs an oxidizing treatment, a nitriding treatment or an oxynitriding treatment to the substrate.

According to the seventh aspect, it is preferable that a flow rate ratio of the $H_2$ gas and the $O_2$ gas contained in the cleaning gas is in a range of about 1:1 to 5:1.

Further, it is preferable that the contaminants are alkali metals or alkali earth metals present in the process chamber.

Further, it is preferable that it is preferable that the cleaning is performed by using an inductively-coupled plasma, a parallel plate plasma or a planar antenna plasma, or by using a plasma formed by introducing microwaves into the process chamber by using a planer antenna having a plurality of slots.

In cleaning the inside of a chamber contaminated with Na or the like by the use of plasma, if the cleaning is performed under conditions allowing active species composed of H and O to be created, Na can be removed efficiently without air venting. In particular, if $H_2$ gas and $O_2$ gas are used as the cleaning gas with their flow rate ratio within a range of 1:1 to 5:1, preferably 2:1, excellent Na reduction effect can be achieved. Thus, it possible to reliably clean the inside of the chamber by making use of plasma, while shortening the times required by the wet cleaning method, including the time for opening the chamber to the atmosphere, the time for wet cleaning the inside of the chamber, the time for assembling a vacuum chamber, the time for re-evacuating the chamber and the time for re-conditioning the chamber.

BRIEF DESCRIPTION OF DRAWINGS

FIG. 2 is a drawing showing the structure of a planer antenna member used in the microwave plasma apparatus of FIG. 1.

BEST MODE FOR CARRYING OUT THE INVENTION

Embodiments of the present invention will be described below in detail with reference to the accompanying drawings.

Figure 1:
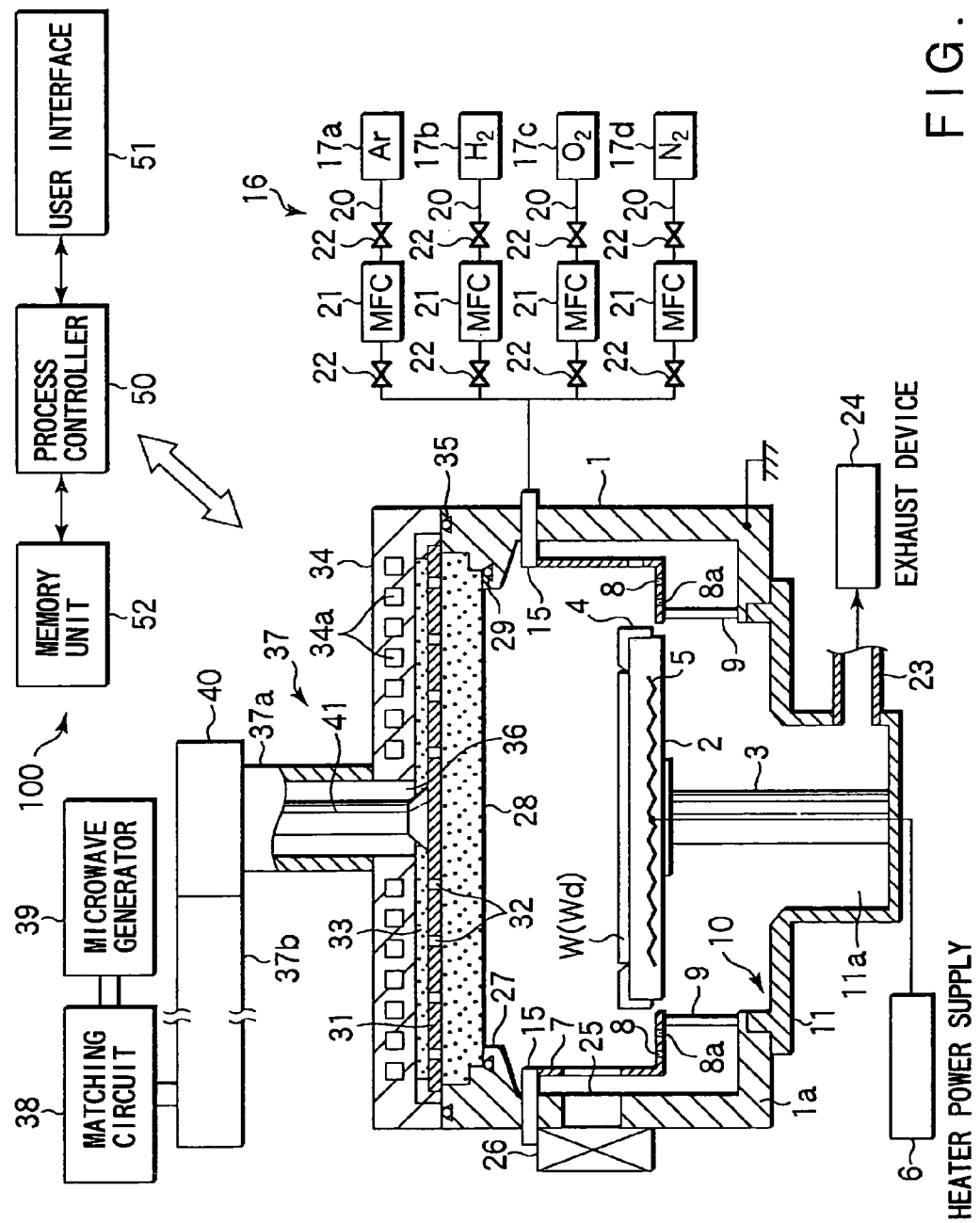
FIG. 1 is a cross sectional view schematically showing an example of a plasma processing apparatus to which a cleaning method for cleaning a process chamber in one embodiment of the present invention is subjected.

FIG. 1 is a cross sectional view schematically showing an example of a plasma processing apparatus to which a cleaning method for cleaning a process chamber in one embodiment of the present invention is subjected.

This plasma processing apparatus is structured as a RLSA microwave plasma processing apparatus that generates plasma of a high density and a low electron temperature in the process chamber by introducing microwave thereinto by using a planer antenna having a plurality of slots, in particular, a RLSA (Radial Line Slot Antenna), and the apparatus is used in, for example, a film forming process such as oxide film formation in semiconductor device manufacturing processes. This plasma processing apparatus 100 has a substantially cylindrical chamber 1 which is grounded and hermetically constructed. The chamber 1 may be rectangularly tubular. The bottom wall 1a of the chamber 1 has a circular opening 10 formed around its center. The bottom wall 1a is provided with an exhaust chamber 11 which communicates with the opening 10 and is projected downward.

In the chamber 1, a susceptor 2 made of a ceramic such as AlN is provided to support thereon a wafer W (a substrate to be processed) or a dummy wafer Wd horizontally. The susceptor 2 is supported by a cylindrical support member 3 made of a ceramic such as AlN. The support member 3 extends upward from the bottom center of the exhaust chamber 11. A guide ring 4 is provided in the peripheral area of the susceptor 2 to guide the wafer W. In addition, a resistance heater 5 is embedded in the susceptor 2. By supplying electric power to the heater 5 from a heater power supply 6, the heater 5 heats the susceptor 2 and the wafer W as a process object is heated by the heat from the susceptor 2. At this time, With a temperature sensor (TC) not shown in the figure, temperature control is possible, for example, over a range of room temperature to 800° C. The inner circumference of the chamber 1 is provided with a cylindrical liner 7 made of quartz. In addition, an annular baffle plate 8 having many evacuation holes 8a is provided around the susceptor 2. The baffle plate 8 is supported by a plurality of support columns 9.

The susceptor 2 has wafer support pins (not shown) to lift up and down the wafer W. The wafer support pin can protrude above and sink below the surface of the susceptor 2.

A side wall of the chamber 1 is provided with an annular gas feed member 15, to which a gas supply system 16 is connected. The gas feed member may be arranged like a shower. The gas supply system 16 has an Ar gas source 17a, a $H_2$ gas source 17b, an $O_2$ gas source 17c and a $N_2$ gas source 17d. These gases respectively reach the gas feed member 15 thorough the gas lines 20 and are introduced into the chamber 1 from the gas feed member 15. Each of the gas lines 20 is provided with a mass flow controller 21 and shutoff valves 22 disposed at the upstream and downstream of the mass flow controller 21.

An exhaust pipe 23 is connected to the side of the exhaust chamber 11. This exhaust pipe 23 is connected to an exhaust device 24 including a high speed vacuum pump. By operating the exhaust device 24, a gas is uniformly discharged from the chamber 1 into the space 11a of the exhaust chamber 11 and discharged therefrom via the exhaust pipe 23. Thus, the inside of the chamber 1 can rapidly be decompressed to a predetermined vacuum of, for example, 0.133 Pa.

The side wall of the chamber 1 is provided with a transfer port 25 for transferring a wafer W (or dummy wafer Wd) to and from a transfer chamber (not shown) adjacent to the plasma processing apparatus 100, and a gate valve 26 for opening and closing the transfer port 25.

The top of the chamber 1 has an opening. Around the opening, an annular support 27 is provided. To the annular support 27, a microwave transmitting plate 28 made of a dielectric material, such as a ceramic e.g., quartz or $Al_2O_3$, is airtightly attached via a sealing member 29 such as an O ring. Thus, the inside of the chamber 1 is kept airtight.

Above the microwave transmitting plate 28, a disc-like planar antenna member 31 is provided so as to face toward the susceptor 2. The planar antenna member 31 is fixed to the top of the side wall of the chamber 1. The planer antenna member 31 comprises a copper or aluminum sheet plated with, for example, gold or silver, and has a great number of microwave-radiating slots 32 formed therethrough according to a certain pattern. For example, these microwave-radiating slots 32 are individually elongated-shaped, and arranged typically on concentric circles while adjacent microwave-radiating slots 32 being arranged to form a T-shape, as shown in FIG. 2. The length of the microwave-radiating slot 32 and the spacing between the microwave-radiating slot 32 are determined according to the wavelength ($\lambda g$) of the microwave. For example, the spacing of the microwave-radiating slots 32 is $\lambda g/2$ or $\lambda g$. The microwave-radiating slot 32 may have another shape such as a circle shape or an arc shape. Further, the arrangement of the microwave-radiating slots 32 is not limited, and may be a spiral arrangement or a radial arrangement instead of the concentric arrangement.

Provided on the top surface of the planar antenna member 31 is a slow-wave member 33 having a higher dielectric constant than that of vacuum. The wavelength of the microwave becomes longer in vacuum. Thus, the slow-wave member 33 has a function to control the plasma by shortening the wavelength of the microwave. The planar antenna member 31 is in close contact with the microwave transmitting plate 28. The slow-wave member 33 is also in close contact with the planar antenna 31.

On the top surface of the chamber 1, a shield cap 34 is provided so as to cover the planar antenna member 31 and the slow-wave member 33. The shield cap 34 is made of a metal such as aluminum or a stainless steel. The gap between the top of the chamber 1 and the shield cap 34 are sealed with a sealing member 35. The shield cap 34 has a cooling water duct 34a formed therein. The shield cap 34, the slow-wave member 33, the planar antenna 31 and the microwave transmission plate 28 are cooled by circulating cooling water through the duct 34a. The shield cap 34 is grounded.

An aperture 36 is formed at the center of the upper wall of the shield cap 34. The aperture is connected with a waveguide 37. To the end of the waveguide 37, a microwave generator 39 is connected via a matching circuit 38. Thus, a microwave with a frequency of, for example, 2.45 GHz, generated by the microwave generator 39, is propagated to the planar antenna member 31 via the waveguide 37. The microwave frequency may be 8.35 GHz, 1.98 GHz or the like, as well.

The waveguide 37 includes a coaxial waveguide 37a extending upward from the aperture 36 of the shield cap 34 and having a circular cross section, and a rectangular waveguide 37b connected to the upper end of the coaxial waveguide 37a via a mode converter 40 and extending horizontally. The mode converter 40 disposed between the rectangular waveguide 37b and the coaxial waveguide 37a has a function of converting the microwave propagating through the rectangular waveguide 37b in TE mode into TEM mode. An internal conductor 41 extends along the center of the coaxial waveguide 37a. The lower end of the internal conductor 41 is connected and fixed to the center of the planar antenna member 31. Thus, the microwave is efficiently and uniformly propagated to the planar antenna member 31 via the internal conductor 41. Further, the microwave is uniformly introduced into the chamber 1 via the microwave-radiating slots 32.

The respective components of the plasma processing apparatus 100 are controlled by a process controller 50 with a CPU connected to those components. Connected to the process controller 50A are: a key board allowing the process manager to input commands to control the plasma processing apparatus 100; and a user interface 51 including a display on which the operational situation of the plasma processing apparatus 100 is visualized.

In addition, the process controller 50 is connected with a memory unit 52 in which control programs, process condition data and the like required by the process controller 50 to implement various processes by controlling the plasma processing apparatus 100 are stored. As necessary, it is possible to call a recipe from the memory unit 52 according to the instructions of the user interface 51. The recipe called from the memory unit 52 can be executed by the process controller 50. Under control of the process controller 50, the plasma processing apparatus 100 carries out the requested process, for example, oxide film formation or cleaning. It is also possible to use recipes stored in other computer-readable storage media such as a CD-ROM, a hard disk drive, a flexible disk and a flash memory. Further, recipes may be transmitted from other apparatus via a dedicated line as necessary.

In the present embodiment, after a certain process is performed on a wafer W or a maintenance operation such as parts replacement is performed, the inside of the chamber 1 of the plasma processing apparatus 100 is cleaned with plasma. Specifically, after the wafer W is processed under a condition of a reduced pressure, the cleaning can be done without opening the chamber 1 to the atmosphere. Thus, as compared with the wet cleaning, it is possible to remarkably reduce the cleaning time since the time for opening the chamber to the atmosphere, the time for wet cleaning, the time for re-evacuation, the time for re-conditioning the process chamber, etc. can be saved. In an example case, the cleaning time can be reduced to 1 to 5 hours whereas 10 to 20 hours are conventionally required.

The following will describe the cleaning process with reference to FIGS. 3A to 3D.

Figure 3A:
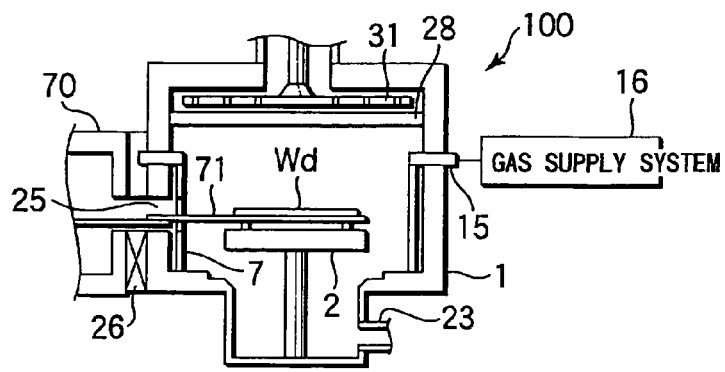
FIG. 3A is a drawing showing a state in which a dummy wafer used for cleaning is placed on a susceptor.

At first, without exposure to the atmosphere, after the gate valve 26 is opened as shown in FIG. 3A, a transfer device 71a carries a clean dummy wafer Wd into the chamber 1 from the transfer chamber 70 maintained under a decompressed condition via the transfer port 25, and places the dummy wafer Wd on the susceptor 2. The dummy wafer Wd is used to protect the susceptor 2 from plasma and evaluate improvement of contamination level by observing the surface of the dummy wafer Wd after cleaning of the chamber 1. This step is not absolutely necessary. If damage to the susceptor 2 need not to be considered, placing the dummy wafer Wd is not necessary.

Figure 3B:
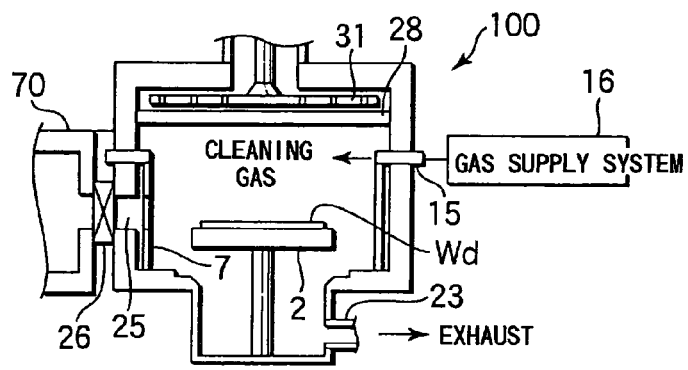
FIG. 3B is a drawing showing a state in which a cleaning gas is introduced into the chamber.
Figure 3C:
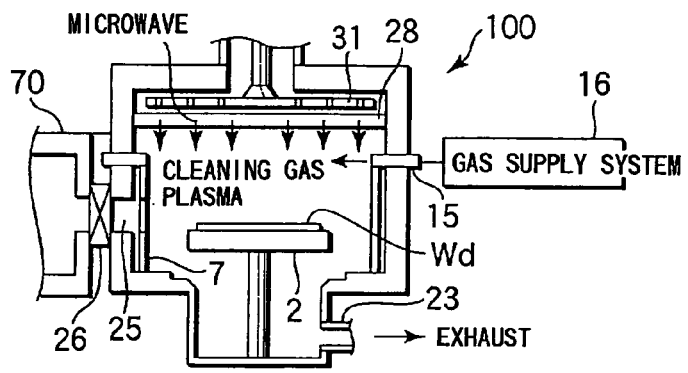
FIG. 3C is a drawing showing a state in which the cleaning gas is converted into plasma.
Figure 3D:
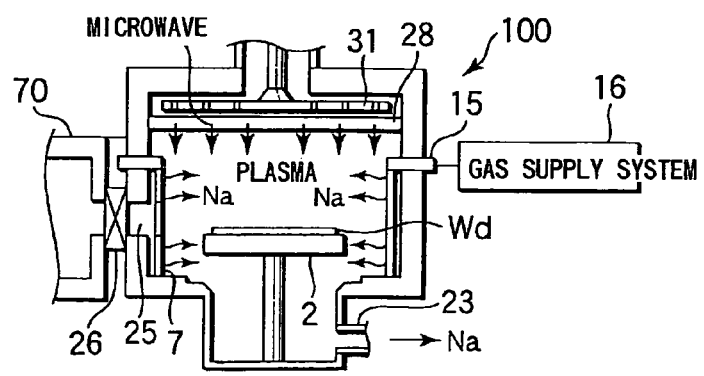
FIG. 3D is a drawing showing a state in which contaminants are cleaned by the plasma of the cleaning gas.

Then, as shown in FIG. 3B, a cleaning gas composed of, for example, $H_2/O_2$, is introduced into the chamber 1 from the gas supply system 16 while evacuating the interior of the chamber 1. Then, as shown in FIG. 3C, the microwave from the microwave generator 39 is introduced into the chamber 1 to convert the cleaning gas into plasma. Specifically, the microwave from the microwave generator 39 introduced into the waveguide 37 through the matching circuit 38; the microwave is supplied through the rectangular waveguide 37b, the mode converter 40 and the coaxial waveguide 37a in that order to the planar antenna member 31; from the antenna member 31, the microwave is radiated into the camber 1 through the microwave transmission plate 28; and the cleaning gas introduced into the chamber 1 is converted into plasma by the microwave. It is considered that, since $H_2O$ exist in the plasma, the $H_2O$ act on Na contaminants which in many cases adhere to the chamber 1 to release them easily, and they can easily be discharged together with the exhaust gas via the exhaust pipe 23, and as a result the interior of the chamber 1 is cleaned. Such a cleaning process may be done every time after a certain process (film formation or the like) to a wafer is completed, or after a certain number of wafers are processed. It is particularly preferable to perform the cleaning process also when the apparatus is restarted after the maintenance of the component parts in the chamber 1 is carried out.

For such a cleaning process, the internal pressure of the chamber 1 is preferably set to a value within a range of 266.7 to 6665 Pa and more preferably from 400 to 1333 Pa. In addition, the internal temperature (for example, the temperature of the susceptor 2) of the chamber 1 is preferably within a range from room temperature to 800° C. Further, the microwave generator 39 is preferably set to generate the microwave with a power within a range of 1 to 4.5 kW.

The introduced cleaning gas may be any sort of gas if the plasma generated in the chamber includes $H_2O$. Preferably, the cleaning gas is a mixed gas of $H_2$ and $O_2$ or a gas containing $H_2O$ (as a water vapor). If a mixed gas of $H_2$ gas+$O_2$ gas is used as the cleaning gas, the $H_2$ gas flow rate may be set to a value within a range of 1 to 2000 mL/min and preferably 500 to 1000 mL/min; and the $O_2$ gas flow rate may be set to be a value within a range from 1 to 2000 mL/min and preferably 25 to 500 mL/min. In this case, the flow rate ratio ($H_2$ gas flow rate:$O_2$ gas flow rate) may be set from 0.5:1 to 20:1 and preferably from 1:1 to 5:1. In particular, the cleaning effect can be maximized by setting the ratio to about 2:1. The cleaning gas may include a noble gas or an inert gas such as Ar. For example, under the aforementioned $H_2/O_2$ gas flow rate, Ar gas at a flow rate within a range of 100 to 3000 mL/min and preferably from 100 to 1000 mL/min may be added.

The cleaning time for one cycle may be may be within a range of 100 to 300 seconds and preferably from 150 to 200 seconds; and it is preferable that each cleaning cycle is followed by an evacuation process or a purge process for promoting discharging of Na whose time length is within a range of 5 to 180 seconds and preferably from 20 to 40 seconds and which process is carried out while the cleaning temperature is maintained. The evacuation process may be carried out by performing evacuation to the fully-evacuated state while stopping supplying the cleaning gas. The purge process may be performed by introducing a purge gas without changing the cleaning pressure. The purge gas may be an inert gas such as $N_2$ gas or Ar gas, or a gas made by adding $H_2$ to these gases. These purge gases may be introduced during evacuation.

As mentioned above, efficient cleaning can be carried out by repeating many numbers of steps continuously for several hours, wherein one step comprises a combination of the cleaning, and the evacuation process or the purging process.

Next, process procedures of the cleaning method according to the present invention will be described below with reference to the timing charts of FIG. 4 through FIG. 6.

Figure 4:
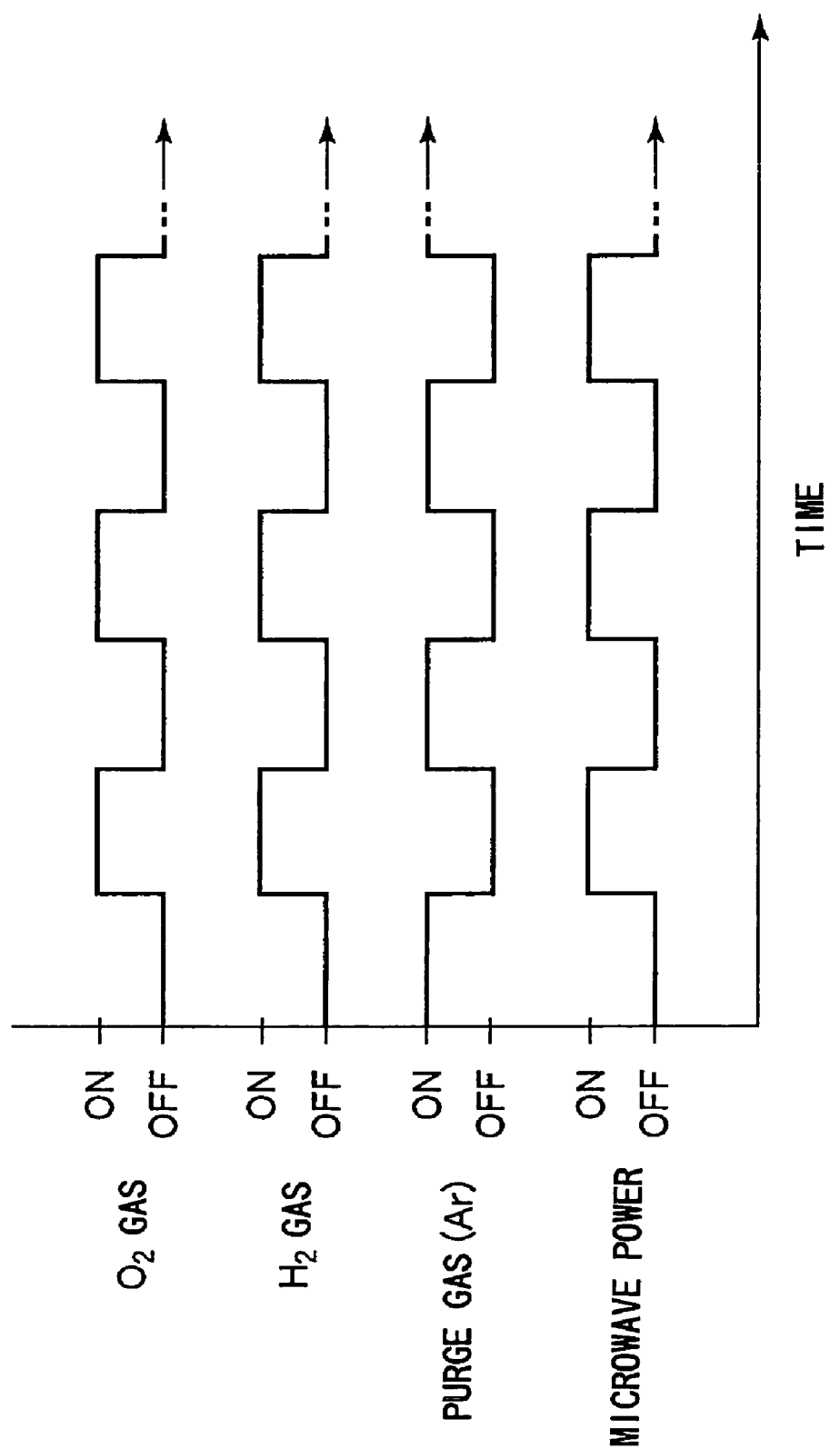
FIG. 4 is a timing chart showing the procedure of a cleaning method in a first embodiment of the present invention.

FIG. 4 shows a first embodiment of the procedure of the cleaning method according to the present invention, in which, as a cleaning gas, a gas containing $H_2$ gas and $O_2$ gas is used. In this embodiment, the interior of the chamber 1 of the plasma processing apparatus 100 is subjected to cleanings using plasma repeatedly a plurality of times; and a purging is performed by introducing Ar gas as a purge gas between cleanings.

Initially, the interior of the chamber 1 of the plasma processing apparatus 100 is purged for a predetermined period within a range of, for example, from 5 to 180 seconds by introducing Ar gas from the gas supply system 16 while evacuating the chamber 1.

Then, introduction of the purge gas is stopped. In place of the purge gas, $O_2$ gas and $H_2$ gas as the cleaning gas are introduced into the chamber 1 from the gas supply system 16. At the point of time when the chamber 1 is filled with the cleaning gas, the microwave power is turned ON to introduce the microwave into the chamber 1 via the planar antenna member 31. In this way, plasma of the cleaning gas is excited in the chamber 1 to perform cleaning. After the cleaning is performed for a predetermined period, the supply of the $O_2$ gas, $H_2$ gas and microwave power are stopped to terminate a first cleaning step. After the first cleaning step is terminated, in place of the cleaning gas, the purge gas is introduced into the chamber 1 to perform a second purge step. Thereafter, the second cleaning step is performed in the same manner as that of the first cleaning step. Further, the second cleaning step is followed by the third purge step, third cleaning step, . . . , nth purge step and nth cleaning step, so that a predetermined number of cleanings are performed repeatedly. In the present embodiment, since a purge gas is introduced in the intervals between cleanings so as to promote the discharging of Na, high cleaning effect can be achieved.

Figure 5:
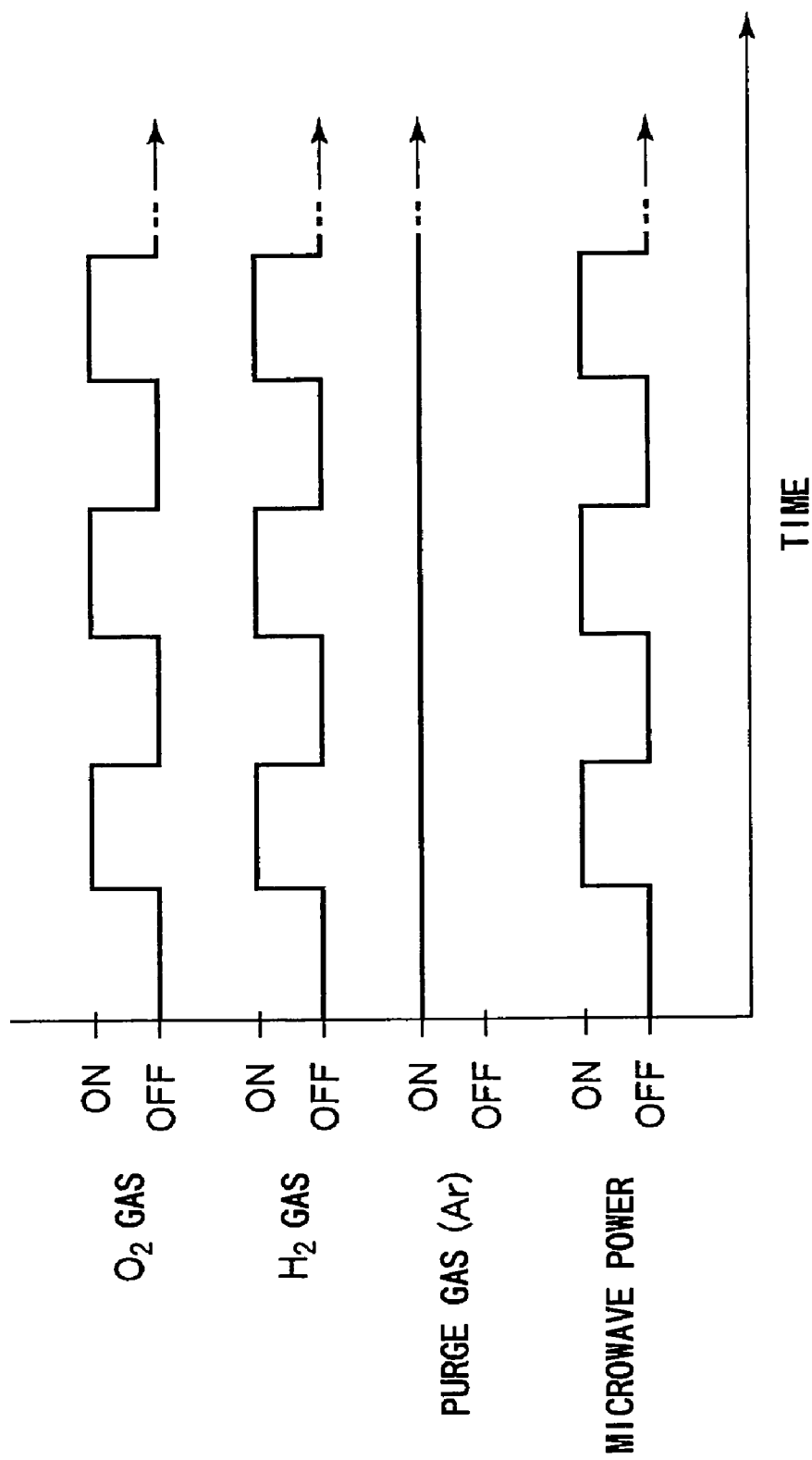
FIG. 5 is a timing chart showing the procedure of a cleaning method in a second embodiment of the present invention.

FIG. 5 shows a second embodiment of the procedure of the cleaning method according to the present invention, in which, as a cleaning gas, a gas containing $H_2$ gas and $O_2$ gas is used. The present embodiment is different from the first embodiment in that Ar gas as a purge gas continues to be introduced into the chamber 1 of the plasma processing apparatus 100 in the course of performing cleanings using plasma a plurality of times repeatedly.

Initially, the interior of the chamber 1 of the plasma processing apparatus 100 is purged by introducing Ar gas from the gas supply system 16 while evacuating the chamber 1.

Then, while introduction of the purge gas is continued, $O_2$ gas and $H_2$ gas as the cleaning gas are introduced into the chamber 1 from the gas supply system 16. At the point of time when the chamber 1 is filled with the cleaning gas, the microwave power is turned ON to introduce the microwave into the chamber 1 via the planar antenna member 31. In this way, plasma of the cleaning gas is excited in the chamber 1 to perform cleaning. After the cleaning is performed for a predetermined period, the supply of the $O_2$ gas, $H_2$ gas and microwave power are stopped to terminate a first cleaning step. After the first cleaning step is terminated, only the purge gas is continued to be introduced into the chamber 1 to perform a second purge step. Thereafter, the second cleaning step is performed in the same manner as that of the first cleaning step. Further, the second cleaning step is followed by the third purge step, third cleaning step, . . . , nth purge step and nth cleaning step, so that a predetermined number of cleanings are performed repeatedly while continuing supplying the purge gas. In the present embodiment, since a purge gas is introduced not only in the intervals between the cleanings but also during the cleanings to further promote the discharging of Na, higher cleaning effect can be achieved.

Figure 6:
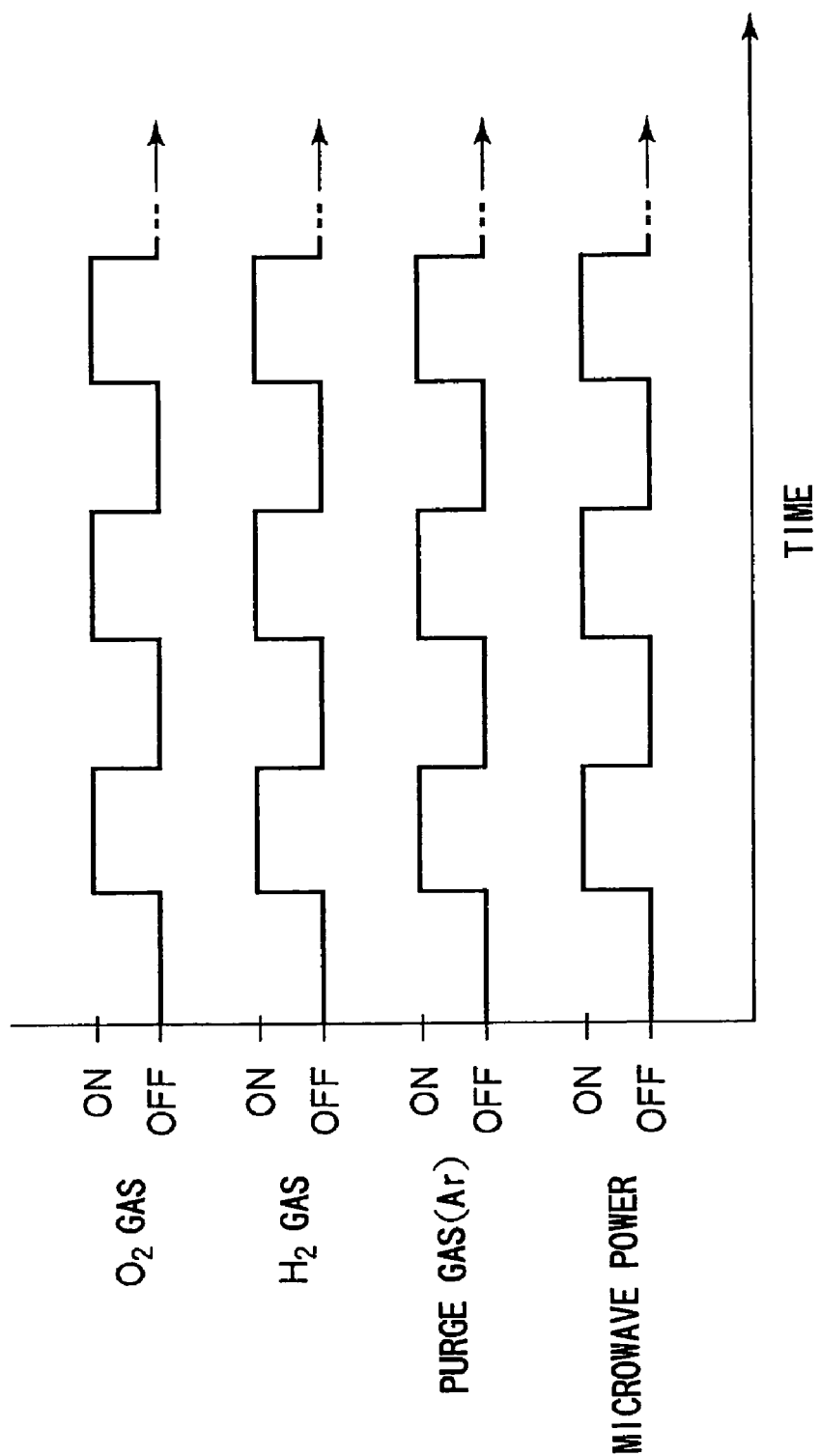
FIG. 6 is a timing chart showing the procedure of a cleaning method in a third embodiment of the present invention.

FIG. 6 shows a third embodiment of the procedure of the cleaning method according to the present invention, in which, as a cleaning gas, a gas containing $H_2$ gas and $O_2$ gas is used. The present embodiment is different from the first embodiment in that purging of the interior of the chamber 1 of the plasma processing apparatus 100 by using a purge gas is not performed and in that the cleanings are performed a plurality of times repeatedly using plasma of a cleaning gas containing a noble gas.

Initially, Ar gas, $O_2$ gas and $H_2$ gas, as the cleaning gas, are introduced into the chamber 1 from the gas supply system 16 while evacuating the chamber 1. At a point of time when the chamber 1 is filled with the cleaning gas, the microwave power is turned ON to introduce the microwave into the chamber 1 via the planar antenna member 31. In this way, plasma of the cleaning gas is excited in the chamber 1 to perform cleaning. After cleaning is performed for a predetermined period, the supply of the Ar gas, the $O_2$ gas, the $H_2$ gas and microwave power are stopped to terminate the first cleaning step. After the first cleaning step is terminated, the chamber 1 is continued to be evacuated without introducing any purge gas. Thereafter, the second cleaning cycle is performed in the same manner as the first cleaning cycle. Further, the second cleaning cycle is followed by the third cleaning cycle, ..., nth cleaning cycle, so that a predetermined number of cleanings are performed repeatedly. In the present embodiment, evacuation is performed in the intervals between cleaning steps to promote the discharging of Na.

Next, experiments conducted to verify the effect of the present invention will be described.

At first, a preliminary experiment was done by using a plasma processing apparatus similar to the plasma processing apparatus 100 of FIG. 1. Plasma processes (dummy operations) by using RLSA plasma were performed with a dummy wafer Wd being loaded in the chamber; and midway therethrough, the dummy wafer was replaced by a sampling wafer and amount of Na atoms adhering to the sampling wafer was measured. By such a dummy operation, it is possible to simulate a situation where a wafer W is contaminated during plasma process by adhering Na atoms which adhered to internal components of the chamber. In this experiment, a mixed gas of $Ar/O_2$ was used as a dummy process gas. Consequently, it is verified that the Na contamination level of the sampling wafer reaches to $1 \times 10^{11}$ (atoms/cm$^2$) or more.

Then, cleaning was performed according to a method in a Comparative Example (conventional method) and a method in an Example.

Comparative Example

A dummy wafer Wd was loaded into the chamber, and plasma cleaning was performed under such conditions that the $Ar/O_2$=375/125 mL/min (sccm), the internal pressure of the chamber was 667 Pa, the power of the microwave generator was 3.5 kW and the temperature of the susceptor 2 was 600° C.

Figure 7:
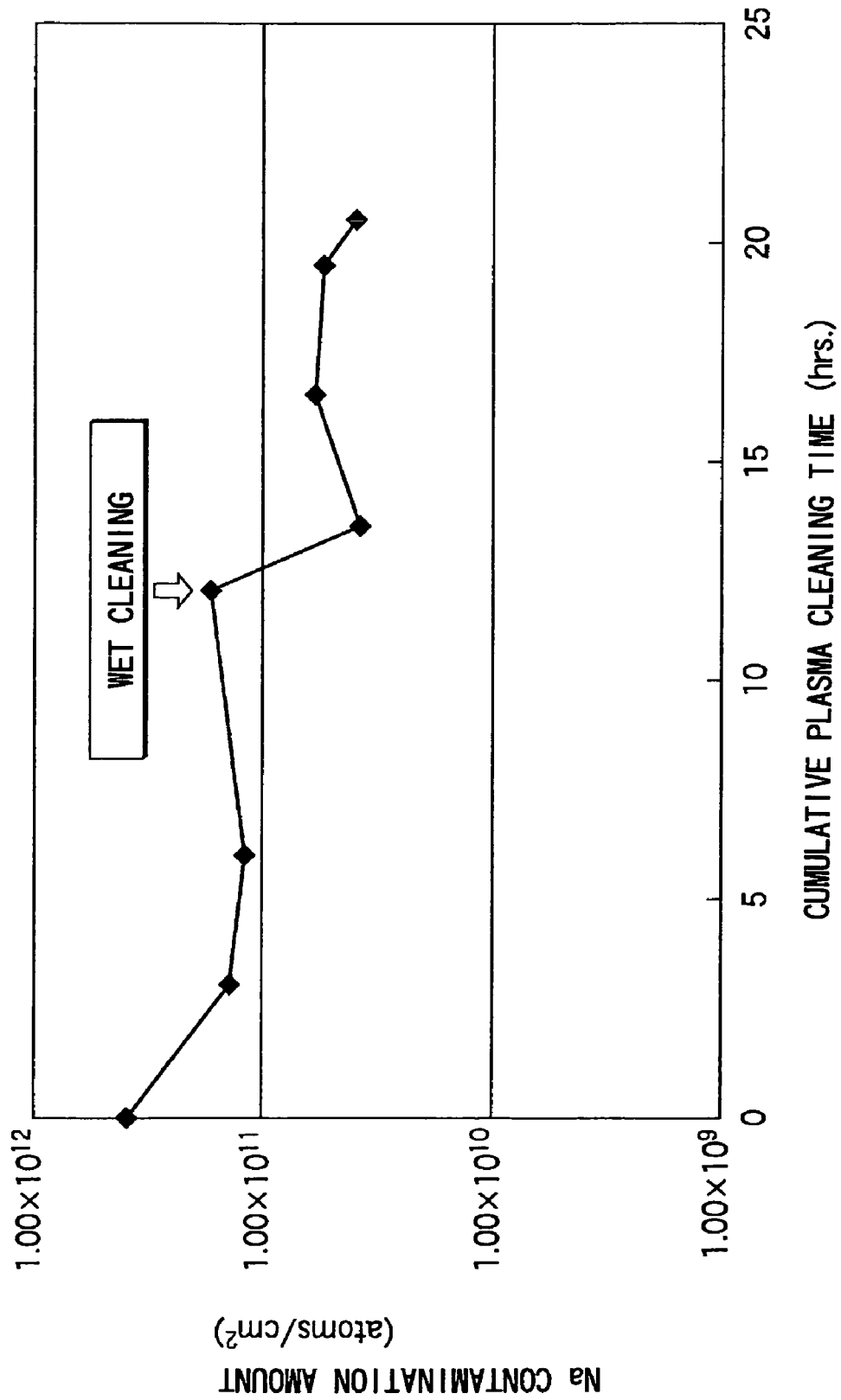
FIG. 7 is a graph indicating the relation between the accumulated plasma cleaning time and the Na contaminant amount in a comparative example.

After a predetermined time elapsed from the start of the cleaning, the dummy wafer Wd was replaced by a sampling wafer and plasma cleaning was continued under such conditions that the $Ar/O_2$=375/125 mL/min (sccm), the internal pressure of the chamber was 667 Pa, the power of the microwave generator was 3.5 kW and the temperature of the susceptor 2 was 600° C. Na contamination on the sampling wafer was measured by TXRF (total reflection X-ray fluorescence spectroscopy; TREX610T, a product of Technos Co., Ltd.) The results are plotted in FIG. 7.

At a point of time when about 12 hours elapsed, the chamber was opened to the atmosphere and wet cleaning was performed. Thereafter, plasma cleaning is performed until the cumulative plasma cleaning time exceeded 20 hours, and measurement is performed using a sampling wafer. The Na density on the sampling wafer was measured. However, the final target value of the Na amount reduction, i.e., less than $1 \times 10^{10}$ atoms/cm$^2$, was not achieved.

Example

A dummy wafer Wd was loaded into the chamber, $H_2$ gas and $O_2$ gas, as a cleaning gas, are introduced, and the susceptor 2 was preheated up to 400° C. under a pressure of 1267 Pa. Thereafter, cleaning was performed under such conditions that $H_2/O_2$=50/50 mL/min (sccm), the internal pressure of the chamber was 1267 Pa, the power of the microwave generator was 4.0 kW. The cleaning time for each cleaning was 180 seconds; and, after every cleaning, evacuation was performed for 30 seconds for the purpose of exhausting with the introduction of the gas being stopped and the temperature is being kept. These constitute one step, and the step was carried out plural times continuously and repeatedly. After 1, 2 and 4 hours elapsed from the start of the cleaning, the dummy wafer Wd was replaced with a sampling wafer, which was subjected to a plasma process whose conditions were the same as those of the aforementioned cleaning except that $O_2$ as a process gas was used at its flow rate of 500 mL/min. The Na contamination amount was measured in the same manner as that in the Comparative Example. The results are shown in FIG. 8.

Figure 8:
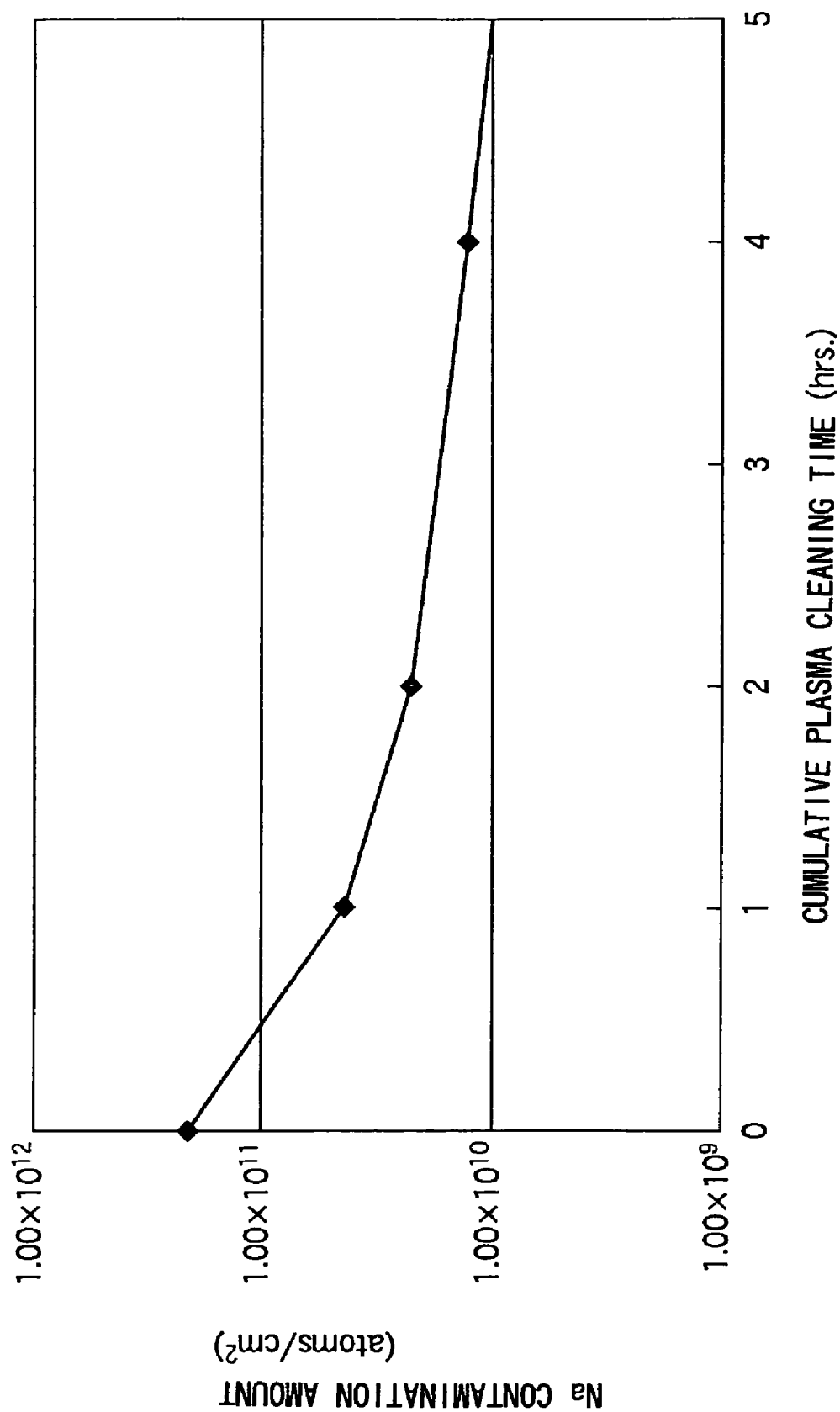
FIG. 8 is a graph indicating the relation between the accumulated plasma cleaning time and the Na contaminant amount in an example.
Figure 9:
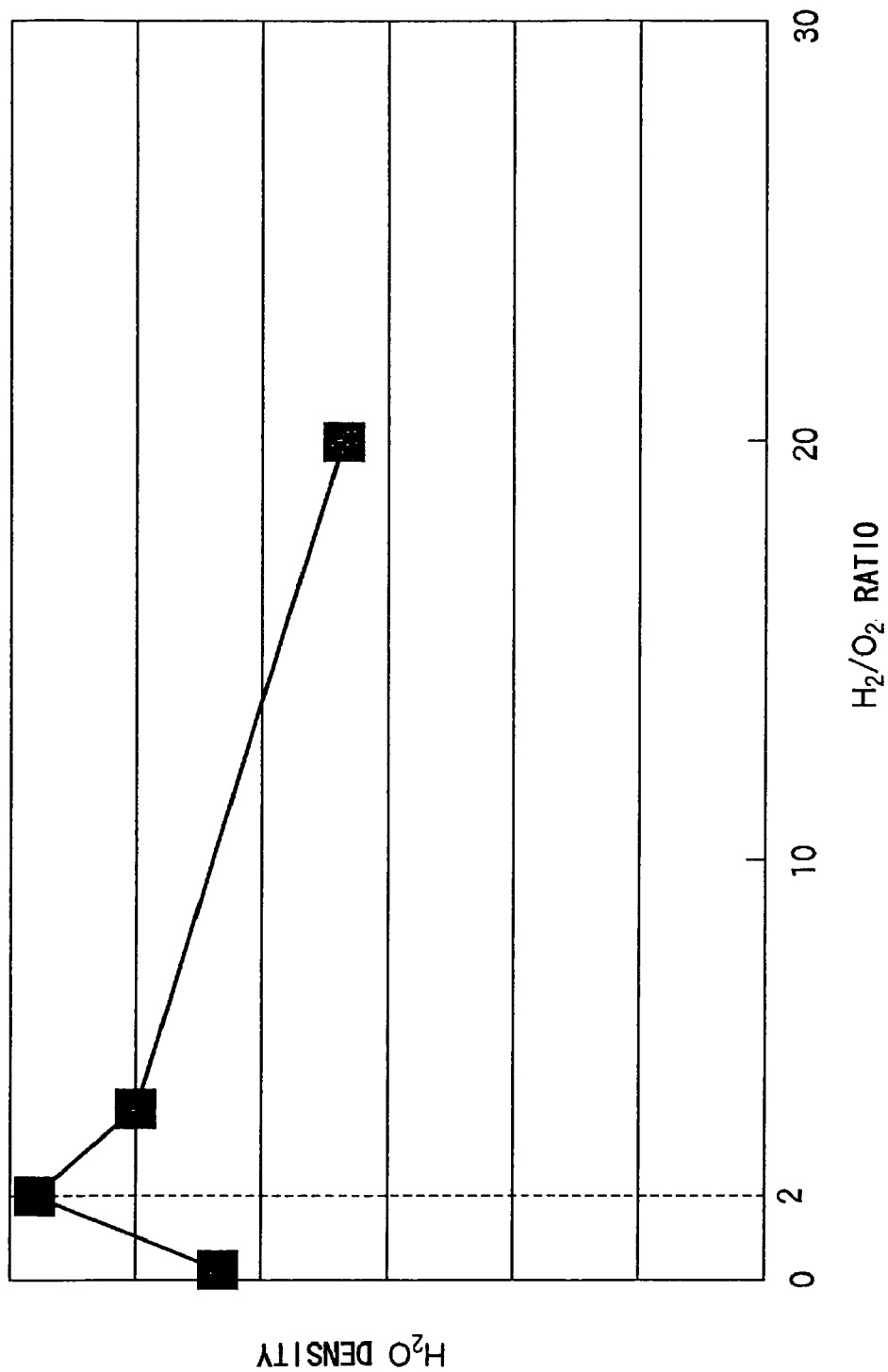
FIG. 9 is a graph indicating the relation between the $H_2/O_2$ flow rate ratio and the $H_2O$ density.

As shown in FIG. 8, in the Example where the cleaning gas comprising $H_2/O_2$ whose flow rate ratio was 1:1 were used, the final target value of the Na amount reduction, i.e., less than $1 \times 10^{10}$ atoms/cm$^2$, was achieved at a cumulative cleaning time of about five hours. This may be because active water molecules ($H_2O$) were created from $H_2$ and $O_2$ contained in the cleaning gas, and these water molecules acted on Na atoms adhering to the inside of the chamber and were discharged from the inside of the chamber together with the Na atoms. An experimental result supporting this fact is shown in FIG. 9. FIG. 9 shows change in $H_2O$ molecule density where plasma cleaning was performed under a pressure of 1133 Pa, a microwave power of 3.5 kW and a temperature of 400° C. while changing the flow rate ratio of $H_2$ gas and $O_2$ gas ($H_2/O_2$ ratio) such that the total flow rate is 100 mL/min. FIG. 9 shows that $H_2O$ was created most efficiently when the flow ratio $H_2/O_2$ was 2. From the above result, it is verified that, for the purpose of the Na contamination reduction, it is most effective to use a cleaning gas having a $H_2:O_2$ flow rate ratio within a range of 0.5:1 to 20:1, preferably from 1:1 to 5:1, and desirably 2:1.

In addition, if evacuation (preferably with concurrent introduction of a purge gas) and plasma cleaning are performed alternately like the aforementioned Example, it is possible to further raise the Na removing efficiency. Although $H_2$, $O_2$, $N_2$ or the like, as well as an inert gas such as Ar, He, Xe, may be used as a cleaning gas, among them Ar, He and $N_2$ are preferable.

As described above, it is possible to efficiently remove Na by performing a cleaning method of the present invention. Thus, it is possible to perform in-situ cleaning without opening the chamber 1 to the atmosphere, when contamination with Na or the like occurs in a plasma process to a substrate such as a wafer W, for example a process such as an oxidizing treatment or a nitriding treatment. Thus, a cleaning method of the present invention can be incorporated as part of a plasma process (an oxidizing treatment, a nitriding treatment or the like) which uses, for example, the plasma processing apparatus 100 of FIG. 1.

That is, the plasma processing method of the present invention may include a cleaning step that introduces a cleaning gas containing at least $H_2$ gas and $O_2$ gas into the chamber 1 of the plasma processing apparatus 100 and generates plasma of the cleaning gas, to remove contaminants in the chamber such as Na, and a plasma treatment step that performs, after the cleaning step, an oxidizing treatment, nitriding treatment, or an oxynitriding treatment to a substrate such as a wafer W.

The oxidizing treatment by the plasma processing apparatus 100 of FIG. 1 may be, for example, a plasma oxidizing treatment that oxidizes silicon on a substrate such as a wafer W by using a process gas containing $H_2$ and $O_2$. In this case, the plasma oxidizing treatment may be performed under such conditions that the process pressure is within a range of 1.3 to 1333 Pa, the process temperature is within a range of 200 to 600° C., the hydrogen gas flow rate in the process gas is within a range of 10 to 500 ml/min, the oxygen gas flow rate is within a range of 10 to 500 ml/min, and the flow rate of a noble gas such as Ar is within a range of 0 to 2000 ml/min.

The nitriding treatment employing the plasma processing apparatus 100 of FIG. 1 may be, for example, a plasma nitriding treatment that nitrides silicon on a substrate such as a wafer W by using a process gas containing $N_2$, $NH_3$, or $N_2$ and $H_2$. In this case, the plasma oxidizing treatment may be performed under such conditions that the process pressure is within a range of 1.3 to 1333 Pa, the process temperature is within a range of 200 to 600° C., the $N_2$ gas flow rate in the process gas is within a range of 10 to 500 ml/min, the hydrogen gas flow rate is within a range of 10 to 500 ml/min, and the flow rate of a noble gas is within a range of 0 to 2000 ml/min. Further, in a case of the oxynitriding treatment, the treatment may be performed by using an inert gas and at least one of NO, $N_2O$, $NO_2$ and $N_2+N_2$ under substantially the same conditions as those for the foregoing oxidizing and nitriding treatments.

While embodiments of the present invention have been described above, the present invention is not limited to the foregoing embodiments. That is, the foregoing embodiments are intended to clarify technical contents of the present invention, and the present invention should not be interpreted so as to be limited to such concrete embodiments and may be embodied with various modifications within the spirit of the present invention and the scope of the claims.

For example, the foregoing embodiment illustrates cleaning in a plasma processing apparatus that generates high-density plasma of a low electron temperature by propagating microwave into the chamber by a planar antenna having a plurality of slots, however, not limited thereto, the present invention is applicable to a processing apparatus whose process vessel (chamber) may internally be contaminated with Na or the like, which may be a plasma processing apparatus such as a capacitively-coupled type, an inductively-coupled type, a parallel plate type, a surface reflection wave type, and a magnetron type.

In addition, while the foregoing embodiment illustrates Na as the contaminant in the chamber, it is also applicable to other contaminants such as alkali metals and alkali earth metals e.g., K, Mg and Ca, and heavy metals, e.g., Fe and Cr.

Further, although $H_2$ gas+$O_2$ gas+Ar gas are illustrated as a cleaning gas, Ar gas may be replaced with another inert gas (He, Ne, Kr, Xe) in the above combination.

INDUSTRIAL APPLICABILITY

The present invention can suitably be used for cleaning a chamber of a plasma processing apparatus employed in the manufacturing processes of various semiconductor devices or the like.

The invention claimed is:

1. A cleaning method comprising:
purging the process chamber by introducing a purge gas into the process chamber while suctioning the process chamber, wherein the process chamber is a process chamber of a substrate processing apparatus which is configured to perform an oxidizing process, a nitriding process or an oxynitriding process to a substrate;
heating an interior of the process chamber; and
cleaning the process chamber by introducing a cleaning gas comprising $O_2$ gas and $H_2$ gas into the process chamber and by generating a plasma of the cleaning gas, thereby removing contaminants comprising alkali metals or alkali earth metals present in the process chamber by active species contained in the plasma,
wherein, when removing the contaminants, temperature of the interior of the process chamber is set within a range of from room temperature to 800° C. and the pressure in the process chamber is set within a range of 266.7 to 6665 Pa,
wherein the purging is performed while the introducing of the $O_2$ gas and $H_2$ gas into the process chamber is stopped and the generating of the plasma is stopped,
wherein said cleaning method is performed during a time period before the substrate processing apparatus performs the oxidizing process, a nitriding process or an oxynitriding process to any substrate after the substrate processing apparatus is subjected to setting-up or maintenance,
wherein an operation set comprising the purging and the cleaning subsequent to the purging is performed for plural times during the time period,
wherein said cleaning method removes the alkali metals or the alkali earth metals which are adhered to surfaces in the process chamber when the setting-up or the maintenance is being performed.

2. The cleaning method according to claim 1, wherein a flow rate ratio of the $H_2$ gas and the $O_2$ gas contained in the cleaning gas is in a range of about 0.5:1 to 20:1.

3. The cleaning method according to claim 1, wherein the contaminants are Na, K, Mg or Ca present in the process chamber.

4. The cleaning method according to claim 1, wherein the cleaning is performed by using a plasma formed by introducing microwaves into the process chamber by using a planer antenna having a plurality of slots.

5. A plasma processing apparatus configured to perform an oxidizing process, a nitriding process or oxynitriding process, comprising:
a plasma supply source that generates plasma;
a process vessel defining a process chamber for performing a process for a substrate by using the plasma;
a substrate support table that supports thereon the substrate in the process vessel;
an exhaust device for decompressing an interior of the process vessel;
a gas supply system for supplying a cleaning gas comprising $O_2$ gas and $H_2$ gas, and a purge gas into the process vessel;
a heater configured to heat an interior of the processing chamber; and
a control unit configured to control operation of said plasma processing apparatus during a time period before the substrate processing apparatus performs the oxidizing process, the nitriding process or the oxynitriding to any substrate after said substrate processing apparatus is subjected to setting-up or maintenance,
to perform a cleaning method comprising
purging the process chamber by introducing a purge gas into the process chamber while suctioning the process chamber;
heating an interior of the process chamber; and
cleaning the process chamber by introducing a cleaning gas comprising $O_2$ gas and $H_2$ as into the process chamber and generating a plasma of the cleaning gas, thereby removing contaminants comprising alkali metals or alkali earth metals present in the process chamber by active species contained in the plasma, wherein, when removing the contaminants the temperature of the interior of the process chamber is set within a range from room temperature to 800° C. and the pressure in the process chamber is set within a range of 266.7 to 6665 Pa, wherein the purging is performed while the introducing of the $O_2$ gas and $H_2$ gas into the process chamber is stopped, and wherein an operation set comprising the purging and the cleaning subsequent to the purging is performed for plural times during the time period.

6. The method according to claim 1, wherein each of the cleaning is performed for 100 to 300 seconds, and each of the purging is performed for 5 to 150 seconds.

7. The method according to claim 1, wherein pressure in the process chamber during the purging is the same as that during the cleaning.

* * * * *